United States Patent
Chang et al.

(10) Patent No.: US 6,779,760 B2
(45) Date of Patent: Aug. 24, 2004

(54) SAFETY SYSTEM FOR OVERHEAD TRANSPORT VEHICLE

(75) Inventors: Cheng-Chang Chang, Tao-Yuan (TW); Li-Ren Lin, Hsin-Chu (TW); Chien-Jung Huang, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/324,407

(22) Filed: Dec. 19, 2002

(65) Prior Publication Data

US 2004/0118980 A1 Jun. 24, 2004

(51) Int. Cl.[7] ................................................. G01N 9/00
(52) U.S. Cl. ........................ 246/1 C; 250/224; 340/673
(58) Field of Search ................................ 246/1 C, 1 R, 246/167 R, 473.3, 473 R, 122 R; 180/167, 168, 169; 340/436, 901, 904, 555, 673; 250/224

(56) References Cited

U.S. PATENT DOCUMENTS

| | | | |
|---|---|---|---|
| 6,437,688 B1 * | 8/2002 | Kobayashi | 340/435 |
| 6,504,144 B1 * | 1/2003 | Murata | 250/224 |
| 6,592,080 B2 * | 7/2003 | Murata et al. | 246/1 C |
| 2003/0005561 A1 * | 1/2003 | Hahn et al. | 29/25.01 |

* cited by examiner

Primary Examiner—Mark T. Le
(74) Attorney, Agent, or Firm—Tung & Associates

(57) ABSTRACT

A safety system for an overhead transport (OHT) vehicle. In one embodiment, the safety system may include a pair of safety panels provided on opposite sides of the load and unload ports on a tool or stocker. An overhead sensor is provided on the OHT and is operably connected to a light curtain on the tool. In the event that the overhead sensor detects an obstruction in the travel path of the OHT during loading of a pod or cassette into the tool or stocker, the light curtain transmits an emergency stop signal to the tool or stocker controller, which terminates further loading operation of the OHT. In another embodiment, the light curtain assumes the look-down sensing function of the overhead sensor in the event that tool components interfere with the look-down function of the overhead sensor.

20 Claims, 3 Drawing Sheets

SAFETY SYSTEM FOR OVERHEAD TRANSPORT VEHICLE

FIELD OF THE INVENTION

The present invention generally relates to overhead transport (OHT) vehicles in an automatic material handling system (AMHS) and more particularly, to a safety system which prevents OHT vehicles from striking and injuring facility personnel during loading and unloading of cassette pods at the load ports of semiconductor processing tools.

BACKGROUND OF THE INVENTION

In the manufacturing of a product, the product is usually processed at many work stations or processing machines. The transporting or conveying of partially-finished products, or work-in-process (WIP) parts, is an important aspect in the total manufacturing process. The careful conveying of semiconductor wafers is especially important in the manufacturing of integrated circuit chips due to the delicate nature of the chips. Furthermore, in fabricating an IC product, a multiplicity of fabrication steps, i.e., as many as several hundred, is usually required to complete the fabrication process. A semiconductor wafer or IC chip must be transported between various process stations in order to facilitate various fabrication processes.

For instance, to complete the fabrication of an IC chip, various steps of deposition, cleaning, ion implantation, etching, and passivation must be carried out before an IC chip is packaged for shipment. Each of these fabrication steps must be performed in a different process machine, i.e., a chemical vapor deposition chamber, an ion implantation chamber, an etcher, etc. A partially processed semiconductor wafer must be conveyed between various work stations many times before the fabrication process is completed. The safe conveying and accurate tracking of such semiconductor wafers or work-in-process parts in a semiconductor fabrication facility is therefore an important aspect of the total fabrication process.

Conventionally, partially finished semiconductor wafers or WIP parts are conveyed in a fabrication plant by automatically-guided vehicles (AGVs) or overhead transport vehicles (OHTs) that travel on predetermined routes or tracks. For the conveying of semiconductor wafers, the wafers are normally loaded into cassettes or SMIF (standardized mechanical interface) pods and then picked up and placed in the automatic conveying vehicles. For identifying and locating the various semiconductor wafers or WIP parts being transported, the cassettes or pods are normally labeled with a tag positioned on the side of the cassette or pod. The tags can be read automatically by a tag reader that is mounted on the guard rails of the conveying vehicle. The AGVs and OHTs normally transport the pods from bay to bay along an interbay loop, and eventually deliver the pods to a robotic storage house, or "stocker", which automatically delivers the pods to an intrabay loop. The AGVs and OHTs also deliver the pods to processing tools and inspection tools.

In modern semiconductor fabrication facilities, OHTs are typically not used to place cassettes containing 8-inch diameter wafers in the tool load ports. Rather, these cassettes are usually placed in the load port manually. On the other hand, cassettes containing 12-inch diameter wafers are heavier (about 8.9 kg when loaded with 25 wafers). Consequently, automatic guided vehicles (AGV) and overhead transport vehicles (OHT) are extensively used to load and unload these cassettes to and from the tool load and unload ports. The AGV and OHT utilize the input/output ports of a processing tool or inspection tool to load or unload wafer lots, i.e., normally stored in SMIF pods. A perspective view of a standard overhead transport vehicle system 10 is shown in FIG. 1.

In the OHT system 10 of FIG. 1, multiple vehicles 12, two of which are shown, travel on a common track 14. Both a load port 18 and an unload port 20 are provided on the tool 16. As the OHT vehicle 12 stops at the position for unloading a SMIF pod 22 into the load port 18, a gripper 15 holding the pod 22 extends downwardly from the vehicle 12 to position the pod 22 in the load port 18. After processing, another vehicle 12 removes the pod 22 from the unload port 20.

Frequently, facility personnel perform various tasks in the area surrounding the tool 16. During loading of the pods 22, the vehicles 12, and particularly the downwardly-extending grippers 15 thereof, as well as the pod 22 carried by the grippers 15, have a tendency to strike and injure the personnel. Accordingly, a device is needed for sensing personnel or other obstructing objects in the vicinity of the load port of a processing tool, inspection tool or stocker and terminating loading of cassettes or pods into the tool or stocker in order to prevent striking of and injury to the personnel.

An object of the present invention is to provide a safety system which may be used to prevent injury to personnel in the vicinity of a processing tool, inspection tool or stocker during loading of wafer cassettes into the tool or stocker.

Another object of the present invention is to provide a safety system which may be used to sense the presence of obstructions in the path of an overhead transport (OHT) vehicle and temporarily stop further loading operation of the OHT in order to prevent injury to personnel.

Still another object of the present invention is to provide a safety system which may include an overhead sensor provided on an OHT, a safety panel or panels provided on a processing tool, inspection tool or stocker and/or a light curtain provided on the tool or stocker to prevent or at least reduce the likelihood of injury to personnel during loading of wafer cassettes into a tool or stocker in a semiconductor fabrication facility.

Yet another object of the present invention is to provide a safety system which may integrate emergency stop signals from an overhead sensor provided on an OHT and from a light curtain provided on a processing tool, inspection tool or stocker to terminate further loading of a wafer cassette or pod into a processing tool or stocker in the event of the presence of an obstruction in the travel path of the wafer cassette or pod.

A still further object of the present invention is to provide a safety system which is capable of routing OHT overhead sensor function from an overhead OHT sensor to a light curtain on a tool or stocker in the event that a component on the tool or stocker interferes with the look-down sensing function of the overhead OHT sensor.

SUMMARY OF THE INVENTION

In accordance with these and other objects and advantages, the present invention is generally directed to a safety system for an overhead transport vehicle (OHT). In one embodiment, the safety system may include a pair of safety panels provided on opposite sides of the load and unload ports on a tool or stocker. An overhead sensor is provided on the OHT and is operably connected to a light curtain on the tool. In the event that the overhead sensor detects an obstruction in the travel path of the OHT during loading of a pod or cassette into the tool or stocker, the light curtain transmits an emergency stop signal to the tool or stocker controller, which terminates further loading operation of the OHT. In another embodiment, the light curtain assumes the look-down sensing function of the overhead sensor in the event that tool components, such as a front control panel, for example, interfere with the look-down function of the overhead sensor.

BRIEF DESCRIPTION OF THE DRAWINGS

The invention will now be described, by way of example, with reference to the accompanying drawings, in which.

DESCRIPTION OF THE PREFERRED EMBODIMENTS

Figure 1:
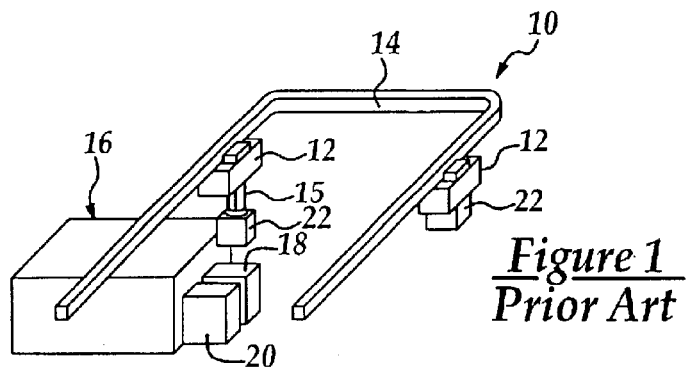
FIG. 1 is a perspective view of a typical conventional OHT system.
Figure 2:
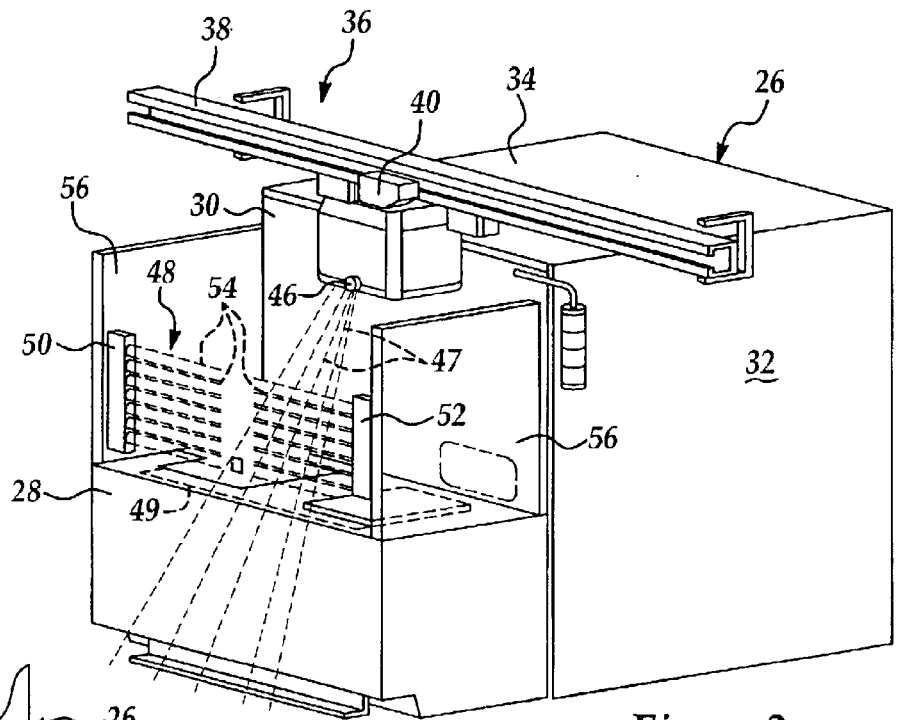
FIG. 2 is a perspective view of a processing tool in implementation of the present invention.
Figure 2A:
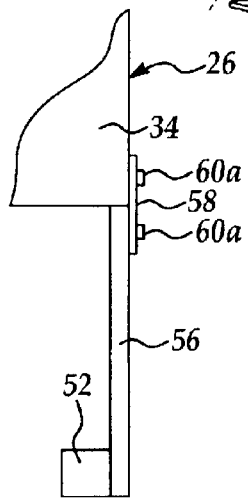
FIG. 2A is a top view, partially in section, of a safety panel component of the present invention, more particularly illustrating a threaded fastener technique for mounting the safety panels onto the tool.
Figure 2B:
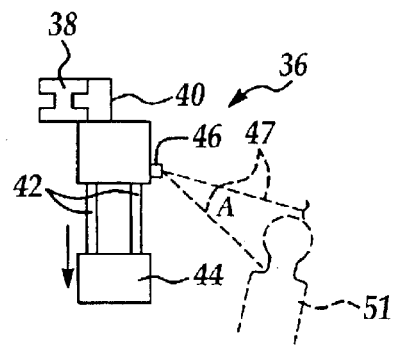
FIG. 2B a side view, partially in section, of an overhead transport vehicle, illustrating detection of an obstruction by a light-emitting overhead sensor on the OHT and termination of the pod or cassette loading operation.
Figure 3:
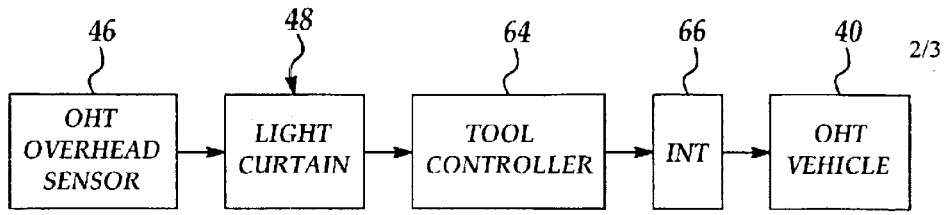
FIG. 3 is a schematic diagram illustrating transmittal of an emergency stop signal from an OHT overhead sensor to a tool controller and termination of the loading operation of an OHT in implementation of the present invention.

Referring initially to FIGS. 2–3, the present invention is directed to a safety system for preventing an OHT vehicle from inadvertently striking and possibly injuring facility personnel working in the vicinity of a tool 26 such as a processing tool, an inspection tool or a stocker, for example, while loading a wafer container into the tool 26. The tool 26 typically includes a load/unload port 28 at the front end 30 thereof. The tool 26 may further include sides 32 and a top 34. However, it is understood that the tool 26 may have various alternative configurations. A track 38 of an OHT (overhead transport) system 36 extends horizontally above the load/unload port 28 of the tool 26, and multiple OHT vehicles 40, one of which is shown, run along the track 38. As shown in FIG. 2B, a wafer container 44, such as a SMIF pod, for example, is carried by each OHT vehicle 40 and contains a wafer cassette (not shown) that holds multiple semiconductor wafers (not shown) in various stages of IC (integrated circuit) fabrication. Multiple gripper arms 42, which are normally retracted into the OHT vehicle 40, are extended downwardly to lower and place the wafer container 44 on the load/unload port 28 for internalization and processing of the wafers in the tool 26. After processing, the same or a different OHT vehicle 40 stops on the track 38 above the load/unload port 28, and the gripper arms 42 of the OHT vehicle 40 are extended downwardly and attached to the wafer container 44. The gripper arms 42 are then retracted back into the vehicle 40 to raise the wafer container 44 for subsequent transport of the wafer container 44 to another tool or processing station in the processing sequence.

The OHT safety system of the present invention includes a pair of typically rectangular safety panels 56 which are mounted on the tool 26, on respective sides of the load/unload port 28. Each safety panel 56 is preferably constructed of a transparent glass or plastic material and is flame-retardant. As shown in FIG. 2A, each safety panel 56 may be removably mounted to the tool 26 typically by mounting a mount bracket 58 on the tool 26 using threaded fasteners 60a and mounting the safety panel 56 on the mount bracket 58 using threaded fasteners 60b. However, it is understood that the safety panels 56 may be either removably or fixedly mounted on the tool 26 using any of a variety of techniques known by those skilled in the art. Accordingly, the safety panels 56 are positioned to prevent injury to personnel (not shown) standing to the sides of the tool 26 during the wafer container loading and unloading process, as hereinafter described.

As further shown in FIG. 2, a light curtain 48 includes a light transmitter 50 that may be mounted on one of the safety panels 56 and a light receiver 52 that may be mounted on the opposite one of the safety panels 56, in horizontal alignment with the light transmitter 50. Accordingly, the light transmitter 50 generates multiple light beams 54 which are received by the light receiver 52. The transmitted light beams 54 form a vertical curtain which spans the light transmitter 50 and the light receiver 52. As shown in FIG. 3, a signal output of the light curtain 48 is operably connected to the tool controller 64 of the tool 26. The tool controller 64 is, in turn, operably connected to the OHT vehicle 40 through an interface 66. In a preferred embodiment, the tool controller 64 is connected to the OHT vehicle 40 through SEMI E84 Bit #8 of the interface 66. Accordingly, any interruption in the light beams 54 of the light curtain 48 is detected by the light receiver 52, which transmits an appropriate signal to the tool controller 64. The tool controller 64 transmits an emergency stop signal, through the electronic interface 66, to the OHT vehicle 40 to halt further loading of a wafer container 44 into the load/unload port 28 of the tool 26.

Figure 2C:
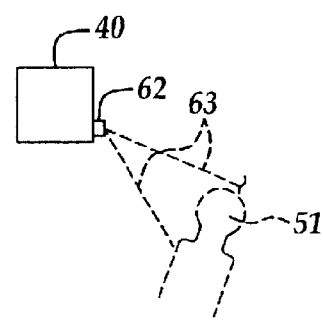
FIG. 2C is a side view of a sonic overhead sensor according to another embodiment of the present invention.

In accordance with one embodiment of the present invention, an OHT overhead transmitter/sensor 46 is mounted on the OHT vehicle 40 and emits a light beam 47 downwardly toward the load/unload port 28 and/or the area in front of the load/unload port 28 of the tool 26. In one embodiment, the OHT overhead transmitter/sensor 46 is a reflect-type sensor and a reflect board 49 is therefore mounted in the load/unload port 28 of the tool 26, or in an alternative location in front of the load/unload port 28, for reflecting the emitted light beam 47 back to the reflector/sensor 46. In another embodiment, the OHT overhead transmitter/sensor 46 is a scan-type sensor, in which case the reflect board 49 is omitted from the. load/unload port 28. In still another embodiment shown in FIG. 2C, a sonic-type OHT overhead transmitter/sensor 62 emits sonic beam 63 which are reflected from the load/unload port 28, and/or the area in front of the load/unload port 28, back to the transmitter/sensor 46. As shown in FIG. 2B, the light beam 47 emitted from the transmitter/sensor 46 typically defines an angle "A" of from about 15 degrees to about 20 degrees. Accordingly, the light beam 47 covers the load/unload port 28 as well as most or all of the area in front of the load/unload port 28. As shown in FIG. 3, the light-type OHT overhead transmitter/sensor 46 (as shown) or the sonic-type transmitter/receiver 62 (FIG. 2C) is operably connected to the signal input of the light receiver 52 of the light curtain 48 in such a manner that interruption or obstruction signals from the light receiver 52 are replaced by interruption or obstruction signals from the OHT overhead transmitter/sensor 46 or the sonic transmitter/sensor 62. The light curtain 48 is connected to the tool controller 64, which is operably connected to the OHT vehicle 40 through the SEMI E84 bit #8 of the electronic interface 66.

Referring again to FIGS. 2–3, in operation of the OHT safety system of the present invention, the OHT vehicle 40 travels along the track 38 of the OHT system 36 and stops above the load/unload port 28 preparatory to loading the wafer cassette 44 in the loading dock of the load/unload port 28. While the light transmitter 50 of the light curtain 48 is disabled, the OHT overhead transmitter/sensor 46 emits a light beam 47 downwardly toward the load/unload port 28 as well as the area in front of the load/unload port 28. Alternatively, the sonic OHT overhead transmitter/sensor 62 (FIG. 2C) emits a sonic beam 63 toward the load/unload port 28 and the area in front of the load/unload port 28. In the event that the light beam 47 (or sonic beam 63, FIG. 2C) is interrupted by an obstruction 51 such as personnel working in front of the load/unload port 28, the change in reflected light or sonic beam is detected by the OHT overhead sensor 46 or the sonic transmitter/receiver 62, respectively, which transmits an appropriate signal indicating the presence of the obstruction 51 to the light receiver 52 of the light curtain 48. The light curtain 48 transmits an appropriate output signal to the tool controller 64, which transmits an emergency stop (ES) signal through the SEMI E84 bit #8 of the electronic interface 66, to the OHT vehicle 40 to halt further extension of the gripper arms 42 from the OHT vehicle 40 and into the load/unload port 28 of the tool 26. After the obstruction 51 is removed from the detection zone imparted by the light beam 47 or the sonic beam 63, the obstruction signal is no longer transmitted from the transmitter/sensor 46 or transmitter/sensor 62 to the light curtain 48, tool controller 64, through the interface 66, and to the OHT vehicle 40. Accordingly, the OHT vehicle 40 resumes loading of the wafer container 44 into the load/unload port 28 by continued extension of the gripper arms 42 from the OHT vehicle 40. It will be appreciated by those skilled in the art that the safety panels 56 prevent the wafer container 44 and/or the gripper arms 42 from striking personnel working in the areas adjacent to the tool 26.

Referring next to FIGS. 4–7, in another embodiment of the present invention, the OHT safety system is designed for tools 70 having a front operation panel 73 which may otherwise interfere with light or sonic beams emitted from an OHT overhead transmitter/sensor 90 provided on an OHT vehicle 84 in accordance with the first embodiment of the present invention heretofore described. Such tools 70 include KE and TEL furnace tools which are well-known by those skilled in the art. Accordingly, the overhead transmitter/sensor 90 is disabled and the "look-down" sensing function of the overhead transmitter/sensor 90, as heretofore described with respect to the transmitter/sensor 46 of FIG. 2, is assumed by a light curtain 92 mounted on the tool 70. The tool 70 typically includes a load/unload port 72 at the front end thereof and may further include sides 76 and a top 78 or may have various alternative configurations.

A pair of typically rectangular safety panels 97 is typically removably or fixedly mounted on the tool 70, on respective sides of the load/unload port 72, as heretofore described with respect to the tool 26 of FIG. 2. Each safety panel 97 is preferably constructed of a transparent glass or plastic material and is flame-retardant. Accordingly, the safety panels 97 are positioned to prevent injury to personnel (not shown) standing to the sides of the tool 70 during the wafer container loading and unloading process, as hereinafter described.

Figure 4:
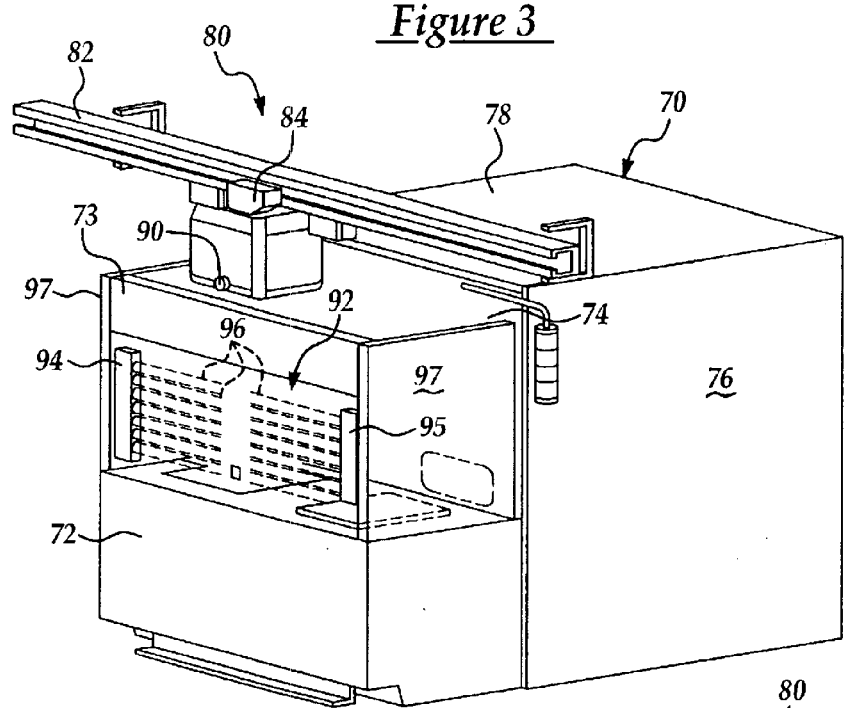
FIG. 4 is a perspective view of a processing tool in another embodiment of the present invention.
Figure 4A:
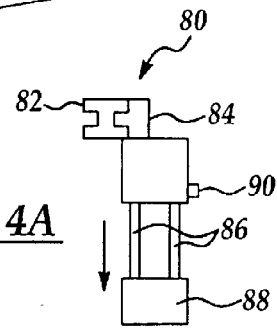
Figure 5:
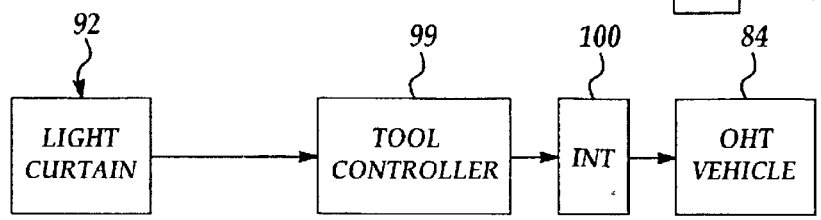
FIG. 5 is a schematic diagram illustrating transmittal of an emergency stop signal from a light curtain to a tool controller and termination of the loading operation of an OHT in implementation of the present invention.

As further shown in FIG. 4, a light curtain 92 includes a light transmitter 94 that may be mounted on one of the safety panels 97 and a light receiver 95 that may be mounted on the opposite one of the safety panels 97 in horizontal alignment with the light transmitter 94. Accordingly, the light transmitter 94 generates multiple light beams 96 which are received by the light receiver 95. The transmitted light beams 96 form a vertical curtain which spans the light transmitter 94 and the light receiver 95. As shown in FIG. 5, a signal output of the light curtain 92 is operably connected to the tool controller 99 of the tool 70. The tool controller 99 is, in turn, operably connected to the OHT vehicle 84 through an interface 100. In a preferred embodiment, the tool controller 99 is connected to the OHT vehicle 84 through SEMI E84 Bit #6 of the interface 100, according to the knowledge of those skilled in the art. Accordingly, any interruption in the light beams 96 of the light curtain 92 is detected as a blockage of light by the light receiver 95, which transmits an appropriate signal indicating the presence of an obstruction between the light transmitter 94 and light receiver 95 to the tool controller 99. The tool controller 99 transmits an emergency stop (ES) signal through the electronic interface 100 to the OHT vehicle B4 in order to halt further loading of a wafer container 88 into the load/unload port 72 of the tool 70.

Figure 6:
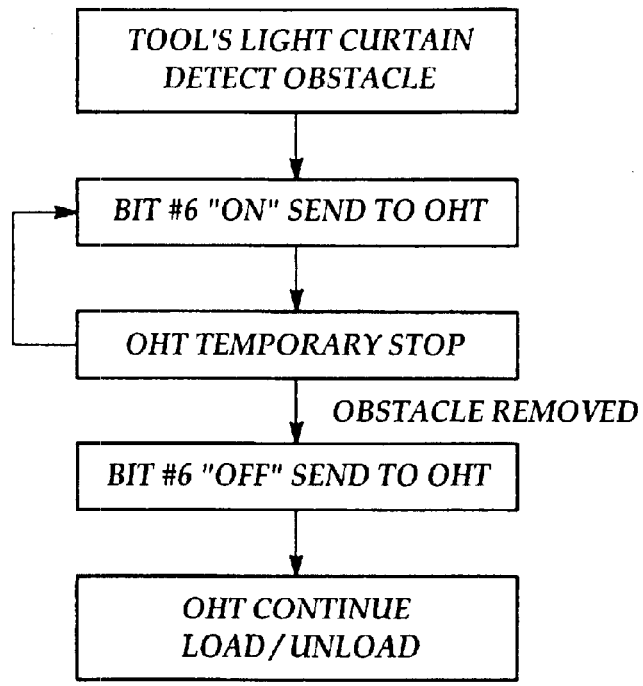
FIG. 6 is a flow diagram illustrating a typical operational schematic of the present invention.
Figure 7:
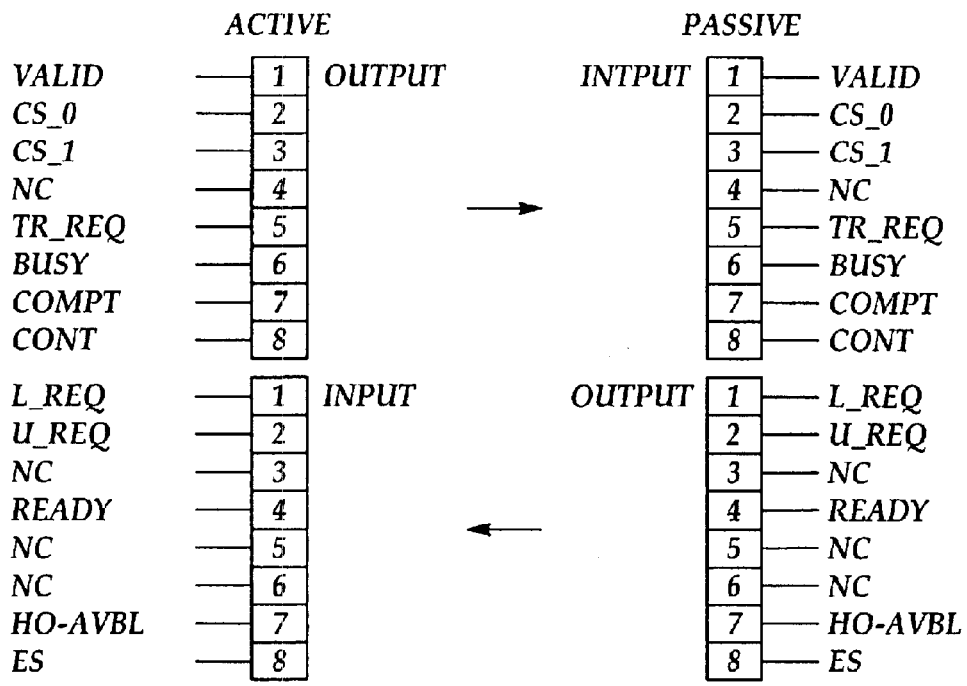
FIG. 7 is a schematic diagram illustrating typical interlock signal bit assignments in implementation of the present invention.

Referring again to FIGS. 4–7, in operation of the second embodiment of the OHT safety system of the present invention, the OHT vehicle 84 travels along the track 82 of an OHT system 80 and stops above the load/unload port 72 preparatory to loading the wafer cassette 88 in the loading dock of the load/unload port 72. While the OHT overhead sensor 90 is disabled, the light transmitter 94 emits horizontal light beams 96 which are intercepted by the light receiver 95. In the event that the light beam 96 is interrupted by an obstruction (not shown) such as personnel working in front of the load/unload port 70, the change in reflected light is detected by the light receiver 95 of the light curtain 92, which transmits an appropriate signal indicating the presence of the obstruction to the tool controller 99. The tool controller 99 transmits an emergency stop (ES) signal through the SEMI E84 bit #6 of the electronic interface 100, to the OHT vehicle 84 to halt further downward extension of gripper arms 86 from the OHT vehicle 84 and into the load/unload port 72 of the tool 70. As shown in FIG. 6, this continues as long as the obstruction interrupts one or more of the light beams 96, bit #6 of the interface 100 remains in the "on" configuration. In the event that the obstruction is removed within a predetermined period of time, such as one minute, of termination of the wafer container-loading operation, the obstruction signal is no longer transmitted from the light receiver 95 of the light curtain 92, the tool controller 99, through the interface 100 and to the OHT vehicle 84, as indicated in FIG. 6. Accordingly, the OHT vehicle 84 resumes loading of the wafer container 88 into the load/unload port 72 by continued extension of the gripper arms 86 from the OHT vehicle 84. The safety panels 97 prevent the wafer container 88 and/or the gripper arms 87 from striking personnel working in the areas adjacent to the tool 70.

While the preferred embodiments of the invention have been described above, it will be recognized and understood that various modifications can be made in the invention and the appended claims are intended to cover all such modifications which may fall within the spirit and scope of the invention.

What is claimed is:

1. An OHT safety system for mounting on a tool and preventing an OHT vehicle from striking an obstruction, comprising:

a light curtain for mounting on the tool;

an OHT overhead transmitter/sensor operably connected to said light curtain for mounting on the OHT vehicle, said OHT overhead transmitter/sensor positioned for emitting a sensor beam generally toward a load/unload port of the tool; and a controller operably connected to said light curtain for connection to the OHT vehicle and receiving an obstruction signal from one of said light curtain and said OHT overhead transmitter/sensor and terminating operation of the OHT vehicle.

2. The system of claim 1 wherein said OHT overhead transmitter/sensor is a light-emitting OHT overhead transmitter/sensor.

3. (original) The system of claim 1 wherein said OHT overhead transmitter/sensor is a sonic OHT transmitter/sensor.

4. The system of claim 1 further comprising an electronic interface operably connected to said controller for receiving said obstruction signal and transmitting an emergency stop signal from said controller to the OHT vehicle.

5. (original) The system of claim 4 wherein said OHT overhead transmitter/sensor is a light-emitting OHT overhead transmitter/sensor.

6. The system of claim 4 wherein said OHT overhead transmitter/sensor is a sonic OHT transmitter/sensor.

7. The system of claim 1 further comprising a pair of safety panels for mounting on the tool in spaced-apart relationship to each other.

8. The system of claim 7 wherein said OHT overhead transmitter/sensor is a light-emitting OHT overhead transmitter/sensor.

9. The system of claim 7 wherein said OHT overhead transmitter/sensor is a sonic OHT transmitter/sensor.

10. The system of claim 7 further comprising an electronic interface operably connected to said controller for receiving said obstruction signal and transmitting an emergency stop signal from said controller to the OHT vehicle.

11. The system of claim 10 wherein said OHT overhead transmitter/sensor is a light-emitting OHT overhead transmitter/sensor.

12. The system of claim 10 wherein said OHT overhead transmitter/sensor is a sonic OHT transmitter/sensor.

13. An OHT safety system for mounting on a tool and preventing an OHT vehicle from striking an obstruction, comprising:

a light curtain for mounting on the tool, said light curtain having a light transmitter for transmitting light and a light receiver for receiving the light;

an OHT overhead transmitter/sensor operably connected to said light curtain for mounting on the OHT vehicle, said OHT overhead transmitter/sensor positioned for emitting a sensor beam in a generally downward direction toward a load/unload port of the tool; and a controller operably connected to said light curtain for connection to the OHT vehicle and receiving an obstruction signal from one of said light curtain and said OHT overhead transmitter/sensor and terminating operation of the OHT vehicle.

14. The system of claim 13 further comprising a pair of safety panels for mounting on the tool in spaced-apart relationship to each other.

15. The system of claim 13 wherein said OHT overhead transmitter/sensor is a light-emitting OHT overhead transmitter/sensor.

16. The system of claim 13 wherein said OHT overhead transmitter/sensor is a sonic OHT transmitter/sensor.

17. The system of claim 13 further comprising an electronic interface operably connected to said controller for receiving said obstruction signal and transmitting an emergency stop signal from said controller to the OHT vehicle.

18. A method for preventing an OHT vehicle loading wafers into a tool from striking an obstruction, comprising the steps of:

providing a light curtain on the tool;

providing an OHT overhead transmitter/sensor on the OHT vehicle and operably connecting the OHT overhead transmitter/sensor to said light curtain;

operably connecting a controller to said light curtain and the OHT vehicle;

emitting a sensor beam from said OHT overhead transmitter/sensor in a generally downward direction toward a load/unload port of the tool and in generally perpendicular relationship to a direction of travel of the OHT vehicle; and transmitting an obstruction signal from one of said light curtain and said OHT overhead transmitter/sensor to said controller and terminating operation of the OHT vehicle by said controller responsive to sensing of the obstruction by said one of said light curtain and said OHT overhead transmitter/sensor.

19. The method of claim 18 further comprising the step of disabling said light curtain and wherein said transmitting an obstruction signal from one of said light curtain and said OHT overhead transmitter/sensor to said controller comprises transmitting said obstruction signal from said OHT overhead transmitter/sensor to said controller.

20. The method of claim 18 further comprising the step of disabling said OHT overhead transmitter/sensor and wherein said transmitting an obstruction signal from one of said light curtain and said OHT overhead transmitter/sensor to said controller comprises transmitting said obstruction signal from said light curtain to said controller.

* * * * *